United States Patent
Tomita et al.

(10) Patent No.: US 7,051,311 B2
(45) Date of Patent: May 23, 2006

(54) SEMICONDUCTOR CIRCUIT DESIGNING METHOD, SEMICONDUCTOR CIRCUIT DESIGNING APPARATUS, PROGRAM, AND SEMICONDUCTOR DEVICE

(75) Inventors: Katsuko Tomita, Kawasaki (JP); Toshiaki Sugioka, Kawasaki (JP); Katsutoshi Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 305 days.

(21) Appl. No.: 10/445,822

(22) Filed: May 28, 2003

(65) Prior Publication Data

US 2003/0237070 A1 Dec. 25, 2003

(30) Foreign Application Priority Data

Jun. 21, 2002 (JP) ............................. 2002-180889

(51) Int. Cl.
*G06F 17/50* (2006.01)
*H01L 29/00* (2006.01)

(52) U.S. Cl. ........................... 716/13; 716/10; 257/508

(58) Field of Classification Search .............. 716/1–18; 257/508, 659, 662
See application file for complete search history.

(56) References Cited

U.S. PATENT DOCUMENTS

| | | | | |
|---|---|---|---|---|
| 5,475,606 A | * | 12/1995 | Muyshondt et al. | 716/19 |
| 5,657,242 A | * | 8/1997 | Sekiyama et al. | 716/15 |
| 5,886,371 A | * | 3/1999 | Shinagawa | 257/207 |
| 5,901,063 A | * | 5/1999 | Chang et al. | 716/4 |
| 6,166,403 A | * | 12/2000 | Castagnetti et al. | 257/211 |
| 6,480,993 B1 | * | 11/2002 | Suto et al. | 716/10 |
| 6,530,066 B1 | * | 3/2003 | Ito et al. | 716/5 |
| 6,622,294 B1 | * | 9/2003 | Saxena et al. | 716/13 |
| 6,728,943 B1 | * | 4/2004 | Kanamoto | 716/12 |
| 2003/0020098 A1 | * | 1/2003 | Sasaki | 257/210 |

FOREIGN PATENT DOCUMENTS

| | | | |
|---|---|---|---|
| JP | 04-239154 | * | 8/1992 |
| JP | 06318597 | * | 11/1994 |
| JP | 9-232547 | * | 9/1997 |

* cited by examiner

*Primary Examiner*—Leigh M. Garbowski
(74) *Attorney, Agent, or Firm*—Armstrong, Kratz, Quintos, Hanson & Brooks, LLP.

(57) ABSTRACT

The present invention provides a semiconductor circuit designing method, comprising a lower level hierarchical designing step of designing a semiconductor circuit inside a block and an upper level hierarchical designing step of designing an external wiring of the block. The above-mentioned lower level hierarchical designing step or upper level hierarchical designing step includes a shield wiring designing step of designing to provide a shield wiring on a boundary part of the block.

17 Claims, 13 Drawing Sheets

F I G. 1
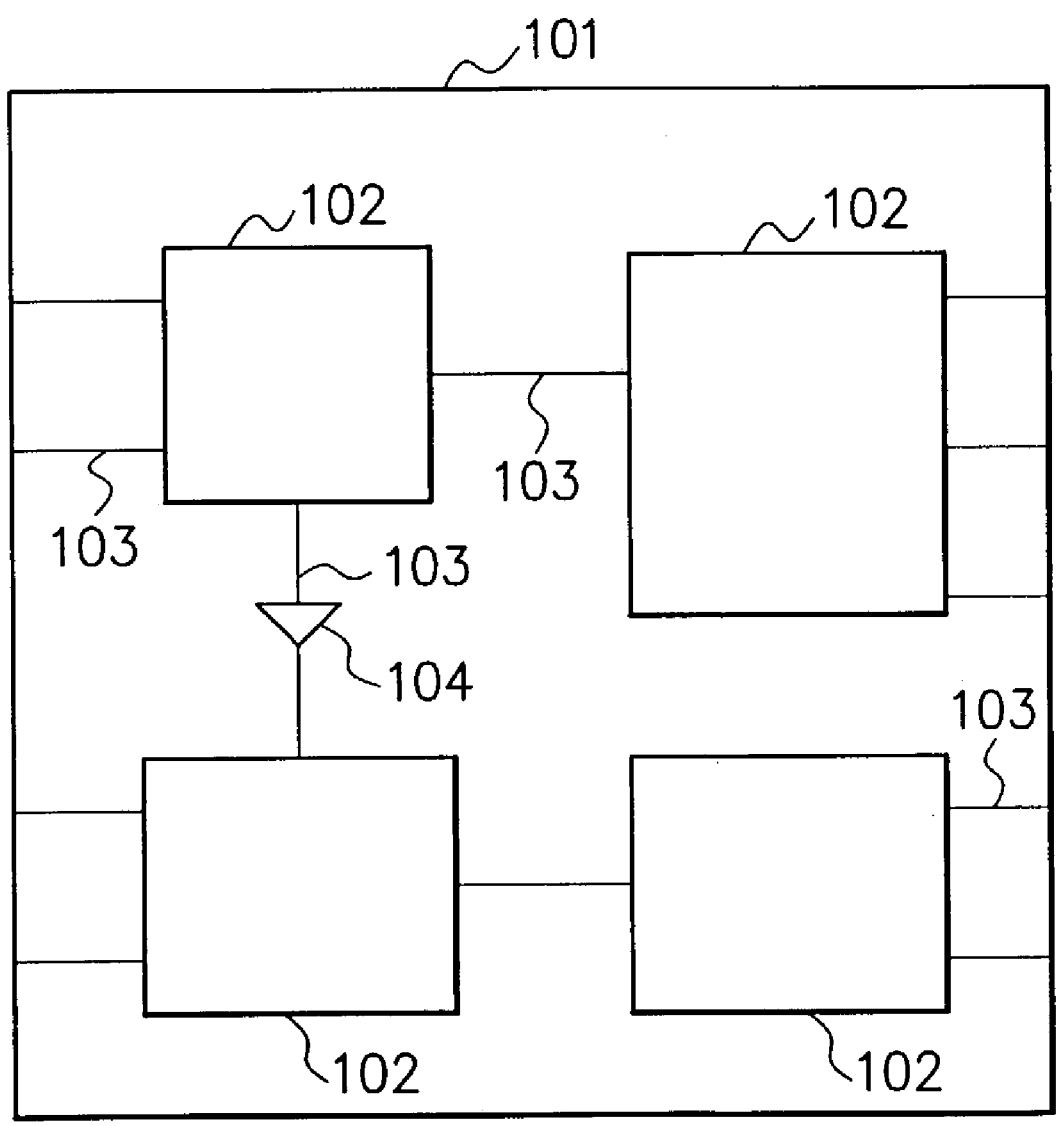

F I G. 2
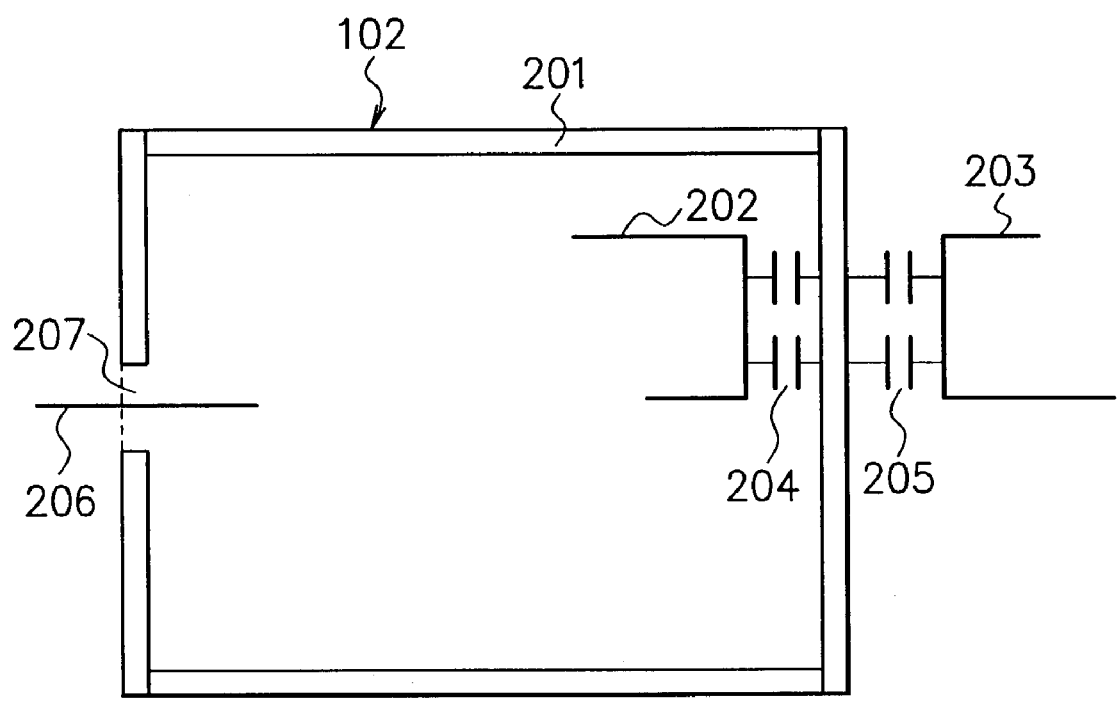

F I G. 5
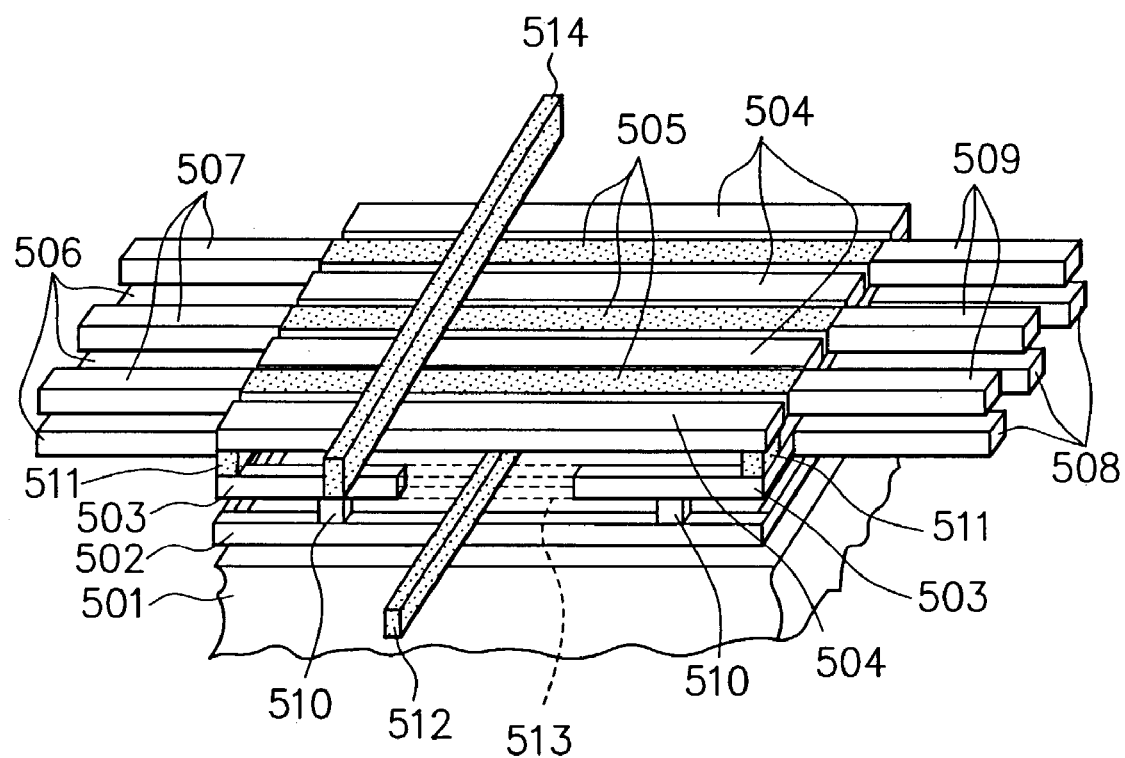

F I G. 8

|  | HLB Shield Route Menu | |
|---|---|---|
| 801 — Target Name | DATA_CORE | |
| 802 — Shield Route | ○ OFF  ○ AT TOP  ◉ AT HLB | |
| 803 — Shield Layers | 3 | |
| 804 — Over HLB Shield Route | ○ OFF  ◉ AT TOP  ○ AT HLB | |
| 805 — Over HLB Shield Layer | 3 | |
|  | OK  CLEAR | |

FIG. 10

```
#CREATED BY POWER-MENU (VOXLOX, YY/MM/DD) yy/mm/dd hh:mm:ss     ~921
#FORMAT VERSON 1
1001~ TARGET NAME : DATA CORE ;
1002~ SHIELD ROUTE : AT HLB ;
1006~ MAX LAYER : 5 ;
1003~ SHIELD LAYERS : 3 ;
1004~ OVER HLB SHIELD ROUTE : AT TOP ;
1005~ OVER HLB SHIELD LAYER : 3 ;
```

FIG. 13A
PRIOR ART
FIG. 13B
PRIOR ART
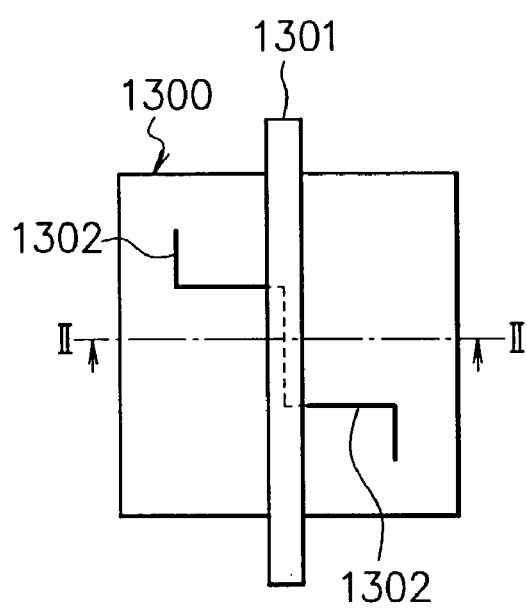
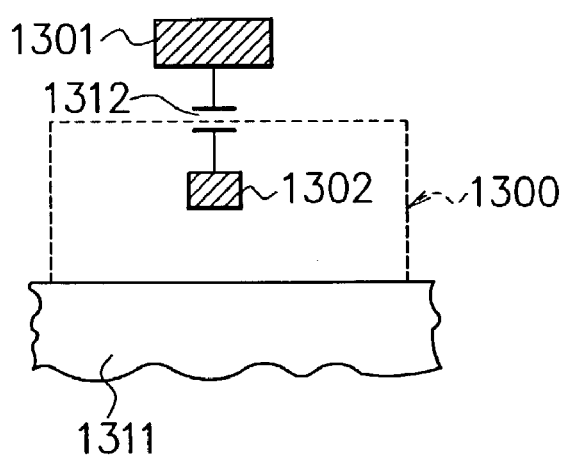

SEMICONDUCTOR CIRCUIT DESIGNING METHOD, SEMICONDUCTOR CIRCUIT DESIGNING APPARATUS, PROGRAM, AND SEMICONDUCTOR DEVICE

CROSS-REFERENCE TO RELATED APPLICATIONS

This application is based upon and claims the benefit of priority from the prior Japanese Patent Application No. 2002-180889, filed on Jun. 21, 2002, the entire contents of which are incorporated herein by reference.

BACKGROUND OF THE INVENTION

1. Field of the Invention

The present invention relates to a semiconductor circuit designing technique and a semiconductor device.

2. Description of the Related Art

In accordance with an enhancement in integration and an increase in scale of an LSI (Large Scale Integration), flat layout designing of collectively processing the entire semiconductor circuit is becoming difficult. Because of this, such a designing method has been applied that blocks are made on a lower level of hierarchy by dividing the inside of an LSI according to the function or the like, and the layout is designed for each of the blocks. This hierarchical layout has realized processing of large-scale data, whereas giving rise to the necessity of taking into account an influence given by external parts across the boundaries of the blocks.

FIG. 12 shows a wiring 1202 on an inner side of a block 1200 and a wiring 1203 on an external side thereof. A wiring 1206 is a wiring for connecting the outside and the inside of the block 1200. There is no physical pattern existing on a boundary of the block 1200. A parasitic wiring capacitance (cross coupling capacitance) 1204 exists between the internal wiring 1202 and the external wiring 1203. In designing the lower level of hierarchy, the wiring 1202 inside the block 1200 is designed. In designing an upper level of hierarchy, the wiring 1203 outside the block 1200 is designed. When the lower level of hierarchy is designed first, the calculation of the wiring capacitance 1204 is difficult since the existence of the external wiring 1203 is not known. When, on the other hand, the upper level of hierarchy is designed first, the calculation of the wiring capacitance 1204 is difficult since the existence of the internal wiring 1202 is not known. Moreover, the calculation of the influence of a crosstalk noise between the internal wiring 1202 and the external wiring 1203 is also difficult.

FIG. 13A is a top view of a semiconductor circuit showing a wiring 1302 on an internal side of a block 1300 and a wiring 1301 on an external side thereof, and FIG. 13B is a cross sectional view taken along the II—II line in FIG. 13A. The block 1300 is provided on a semiconductor substrate 1311. The external wiring 1301 passes over the block 1300. A parasitic wiring capacitance 1312 exists between the external wiring 1301 and the internal wiring 1302. In this case, too, the calculation of the wiring capacitance 1312 is difficult. The calculation of the influence of a crosstalk noise between the external wiring 1301 and the internal wiring 1302 is also difficult.

The following methods are conceivable for the layout designing in the above-described case.

(1) To prepare a region with no wiring on the internal side of the block boundary in order to make a circuit inside the block not easily susceptible to the influence of the upper level of hierarchy (2) To extract arrangement and wiring information that a specific range on the internal side of the block boundary has, from data on the blocks of the lower level of hierarchy, and capacitance value calculation and crosstalk noise verification are carried out on the upper level of hierarchy (3) To prohibit the use of wirings passing over the blocks by a design rule However, the following problems arise in accordance with miniaturization of technology.

(1) an increase in regions which are not usable in arrangement and wiring processing (2) an increase in data amount required to be extracted FIG. 14 is a flow chart showing a hierarchical designing procedure of a semiconductor circuit according to a prior art. This designing is based on CAD (computer-aided design).

In Step S1401, a floor plan is designed, in which the position, size, external wirings, and so on of blocks are roughly determined on an upper level of hierarchy. Next, in Step S1402, power consumption of the upper level of hierarchy is estimated. Next, in Step S1403, power source wirings are laid on the upper level of hierarchy. At this time, the thickness of the power source wirings is determined depending on the aforesaid power consumption. Next, in Step S1405, it is checked whether or not there exists any unprocessed data. When there exists an unprocessed lower level hierarchical data, Step S1407 is initiated while Step S1421 is initiated when no unprocessed data exists. Step S1406, which includes Steps S1407 to S1416, is for processing the inside of blocks of the lower level of hierarchy.

In Step S1407, power consumption is estimated. Next, in Step S1408, power source wirings are laid. At this time, the thickness of the power source wirings is determined depending on the above-mentioned power consumption. Next, in Step S1409, the arrangement and wiring of cells in a block are performed. Next, in Step S1410, a resistive component and a capacitive component (RC) are extracted. At this time, the RC extraction is not accurate since it is performed assuming a certain state as boundary conditions of the block. Next, in Step S1411, delay time is calculated based on the above-mentioned resistive component and capacitive component. Next, in Step S1412, a crosstalk noise is verified. At this time, this verification is not accurate since the verification is performed assuming a certain state as the boundary conditions of the block. When the verification result indicates that the crosstalk noise gives an adverse effect, a crosstalk noise error is outputted. Next, in Step S1413, timing of a circuit inside the block is verified based on the above-mentioned delay time. When the verification result indicates that the timing is not within a prescribed value range, a timing error is outputted.

Next, in Step S1414, it is checked whether or not there exists any crosstalk noise error or timing error. When an error exists, Step S1415 is initiated while Step S1416 is initiated when no error exists. In Step S1415, the arrangement, wiring, and so on of the cells are corrected and the processing from Step S1410 is processed again. The above processing is repeated until no error is left. When no error is left, information relating to the block is extracted in Step S1416. For example, information on the arrangement, wiring, and so on that a specific range on the internal side of the boundary of the block has is extracted. Thereafter, the procedure returns to Step S1405. When there exists any other unprocessed block, the above processing in Step S1406 is repeated. When the processing for all the blocks has been completed, Step S1412 is initiated. Steps S1421 to S1430 are for design processing of the upper level of hierarchy.

In Step S1421, the information on the blocks of the lower level of hierarchy is read. Next, in Step S1422, the power source wirings are laid in detail. Next, in Step S1423, the arrangement, wiring, and so on of the blocks and the cells are performed in Step S1423. Next, in Step S1424, a resistive component and a capacitive component (RC) are extracted. At this time, the arrangement and wiring information in the specific range on the internal side of the boundaries of the blocks, which is extracted in Step S1416, is merged together to extract the RC. Next, in Step S1425, delay time is calculated based on the above-mentioned resistive component and capacitive component. Next, in Step S1426, a cross talk noise is verified. At this time, the arrangement and wiring information in the specific range on the internal side of the boundaries of the blocks, which is extracted in Step S1416, is merged together to execute the verification, and a crosstalk noise error is outputted according to the verification result. Next, in Step S1427, timing of a circuit of the upper level of hierarchy is verified based on the above-mentioned delay time, and a timing error is outputted according to the verification result.

Next, in Step S1428, it is checked whether or not there exists any crosstalk noise error or timing error. When there exists any error, Step S1429 is initiated while Step S1431 is initiated when there exists no error. In Step S1429, it is checked which of the lower level of hierarchy or the upper level of hierarchy causes the error. When the upper level of hierarchy causes the error, Step S1430 is initiated. When the lower level of hierarchy causes the error, the processing from Step S1409 is repeated to redesign the inside of the blocks. For example, when the assumption of the conditions of the block boundaries in Steps S1410 and S1412 proves to be wrong to a great degree, the inside of the blocks is redesigned.

In Step S1430, the arrangement, wiring, and so on of the blocks and the cells are corrected, and the processing from Step S1424 is repeated. In Step S1428, when it is judged there exists no error, Step S1431 is initiated to generate a mask pattern of each layer of a semiconductor device.

The above-described hierarchical designing poses the following problems.

(1) The wiring capacitance value cannot be determined accurately since the conditions of the block boundaries are not fixed until the arrangement and wiring of the inside of the blocks of the lower level of hierarchy are finished.

(2) The influence due to the wirings only passing over the blocks has to be determined after the layout of the upper level of hierarchy.

(3) Due to a trouble occurring in the block boundaries, the processing from Step S1409 sometimes has to be repeated after Step S1429 in FIG. 14 to correct the blocks of the lower level of hierarchy again and to perform the error check again on the upper level of hierarchy.

SUMMARY OF THE INVENTION

It is an object of the present invention to realize simple, quick, and accurate designing of a semiconductor circuit by shielding a boundary part of a block to completely separate the internal part of the boundary and the external part thereof.

According to an aspect of the present invention, provided is a semiconductor circuit designing method, comprising a lower level hierarchical designing step of designing a semiconductor circuit inside a block and an upper level hierarchical designing step of designing an external wiring of the block. The above lower level hierarchical designing step or the upper level hierarchical designing step includes a shield wiring designing step of designing to provide a shield wiring on a boundary part of the block.

Since the boundary part of the block can be shielded, an internal side and an external side of the boundary can be completely separated from each other so that the block can be considered as one independent part. This enables the lower level hierarchical designing and the upper level hierarchical designing to be independent from each other, thereby realizing simple, quick, and accurate designing of a semiconductor circuit.

BRIEF DESCRIPTION OF THE DRAWINGS

FIG. 1 is a plan view of a semiconductor circuit to be designed according to an embodiment of the present invention;

FIG. 2 is a view showing a semiconductor circuit having a shield wiring provided on a boundary part of a block;

FIG. 5 is a perspective view of a semiconductor device corresponding to the semiconductor circuit in FIGS. 4A and 4B;

FIG. 8 is a view showing a screen for use in designating a shield method;

FIG. 10 is a view showing a content example of a shield wiring method designation file;

FIG. 13A is a top view of a semiconductor circuit showing an internal wiring and an external wiring of a block, and FIG. 13B is a cross sectional view taken along the II—II line in FIG. 13A.

DETAILED DESCRIPTION OF THE PREFERRED EMBODIMENTS

Figure 3:
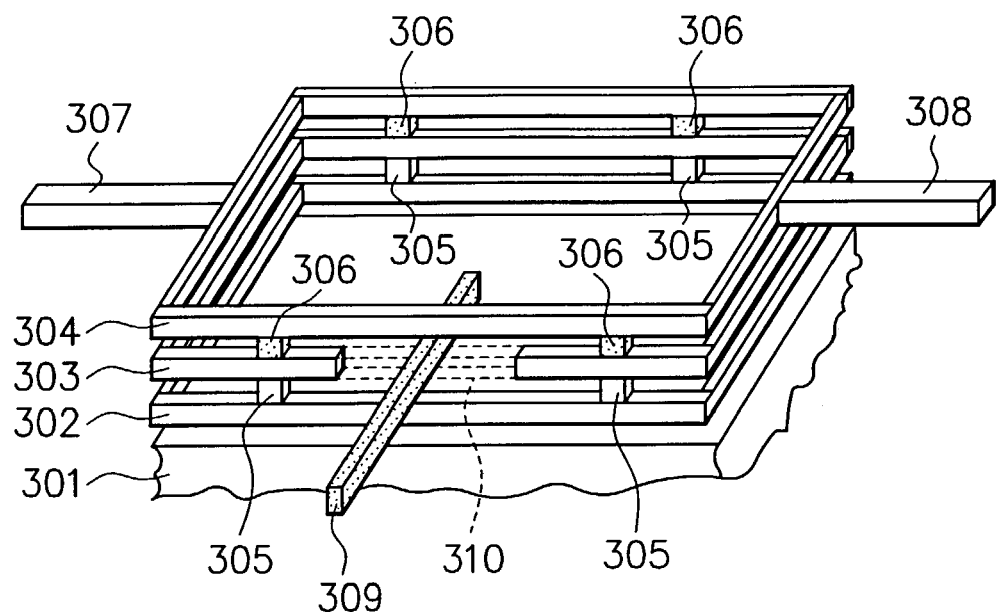
FIG. 3 is a perspective view of a semiconductor device corresponding to the semiconductor circuit in FIG. 2.

FIG. 1 is a plan view of a semiconductor circuit to be designed according to an embodiment of the present invention. A semiconductor chip 101 is a semiconductor device. A plurality of blocks 102 are provided on the semiconductor chip 101. The blocks 102 divide the semiconductor chip 101 according to the function, the number of gates, and the like. External wirings 103 are wirings in external parts of the blocks 102. A cell 104, which is a logical element, is provided in the external part of the block 102. Hierarchical designing is divided into upper level hierarchical designing and lower level hierarchical designing. In the lower level hierarchical designing, the arrangement, wiring, and so on of cells inside the block 102 are designed. In the upper level hierarchical designing, the arrangement of the cell 104, the layout of the external wirings 103, and so on are designed. Incidentally, hierarchical designing of three levels or more is also possible, providing an additional block inside the block 102. The case of the hierarchy of two levels, the upper level and the lower level, will be explained below as an example.

Figure 12:
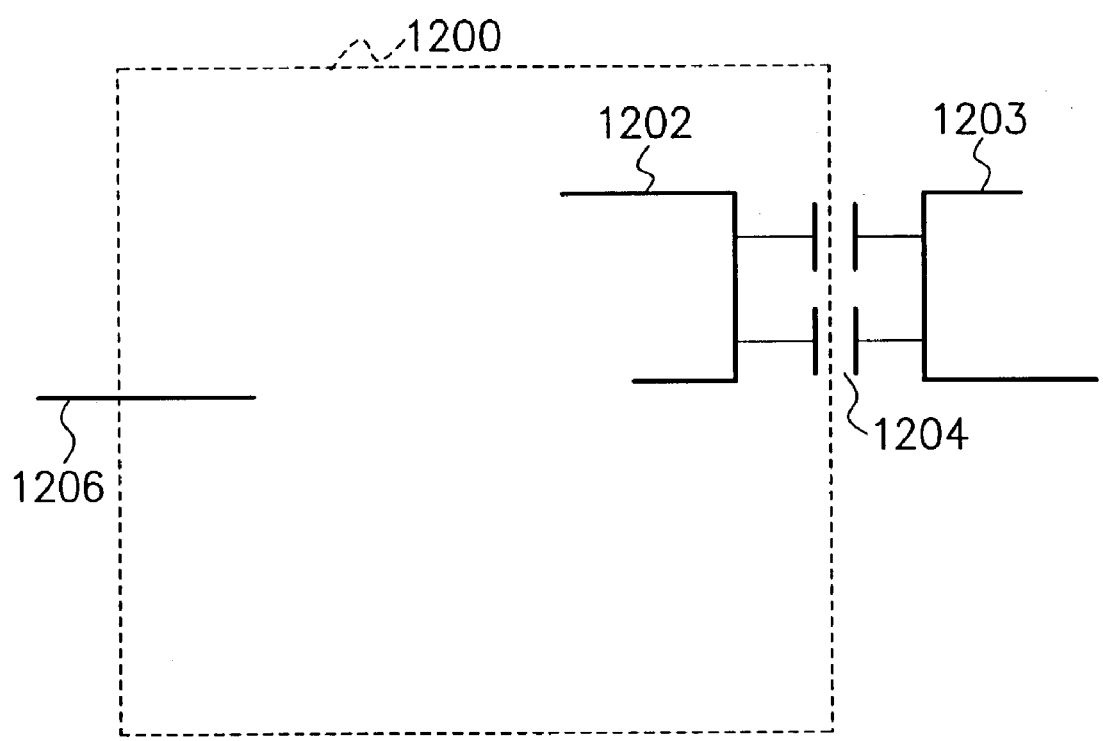
FIG. 12 is a semiconductor circuit diagram showing an internal wiring and an external wiring of a block.

FIG. 2, which corresponds to FIG. 12, shows a semiconductor circuit including a wiring 202 on an internal side of a block 102 and a wiring 203 on an external side thereof. A wiring 206 is a wiring for connecting an internal part and an external part of the block 102. On the boundary of the block 102, a shield wiring 201 is provided. The use of a computer program enables automatic generation of the shield wiring 201 by determining the size and position of the block 102. The shield wiring 201 is a reference potential (for example, a ground potential) wiring or a power source potential wiring.

The shield wiring 201 is provided between the internal wiring 202 and the external wiring 203. Therefore, a parasitic capacitance 204 exists between the internal wiring 202 and the shield wiring 201, and a parasitic capacitance 205 exists between the external wiring 203 and the shield wiring 201. In other words, there is no need to take into account a coupling capacitance between the internal wiring 202 and the external wiring 203. In the lower level hierarchical designing, the parasitic capacitance 204 between the internal wiring 202 and the shield wiring 201 can be calculated irrespective of the existence or nonexistence of the external wiring 203. Similarly, in the upper level hierarchical designing, the parasitic capacitance 205 between the external wiring 203 and the shield wiring 201 can be calculated irrespective of the existence or nonexistence of the internal wiring 202. Further, there is no need to take into account a crosstalk noise between the internal wiring 202 and the external wiring 203. The shield wiring 201 thus laid on a frame part of the block 102 is hereinafter referred to as a frame shield wiring.

The boundary part of the block 102 is shielded with the shield wiring 201 so that the internal part of the boundary and the external part of the boundary are completely separated from each other and the block 102 can be considered as one independent part. Consequently, the lower level hierarchical designing and the upper level hierarchical designing are made independent from each other, which enables simple, quick, and accurate designing of the semiconductor circuit.

Further, the shield wiring 201 has an aperture 207 for a wiring 206, which connects the internal side and the external side of the block 102, to pass therethrough. The use of a computer program enables automatic generation of the aperture 207 of the shield wiring 201 by determining the position and thickness of the wiring 206.

FIG. 3 is a perspective view of a semiconductor device corresponding to the semiconductor circuit in FIG. 2. The structure of this semiconductor device will be explained. A first to a third wiring layer are formed on a semiconductor substrate 301 via respective insulation layers. A shield wiring 302 is formed on the first wiring layer, a shield wiring 303 is formed on the second wiring layer, and a shield wiring 304 is formed on the third wiring layer. Contact portions 305 electrically connect the shield wirings 302 and 303 to each other. Contact portions 306 electrically connect the shield wirings 303 and 304 to each other. A reference potential supply wiring 307 supplies a reference potential to the shield wiring 302 from the external part. A reference potential supply wiring 308 supplies a reference potential to the shield wiring 304 from the external part. When both of the reference potential supply wirings 307 and 308 are provided, though only either one may be provided, electric charge is prevented from staying on the shield wirings 302 to 304. The shield wiring 303 has an aperture 310 for a wiring 309, which connects the internal side and the external side of the block, to pass therethrough. Incidentally, power source potential supply wirings, instead of the reference potential supply wirings 307, 308, may be connected to the shield wirings 302 to 304. However, since a reference potential varies to a smaller extent than a power source potential, the reference potential supply wirings are more preferable. The shield wirings 302 to 304 are provided on the boundary parts of the respective wiring layers of the block.

Figure 4A:
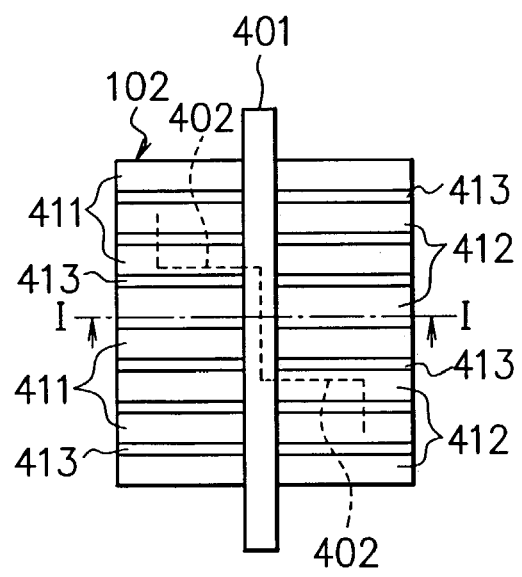
FIG. 4A is a top view of a semiconductor circuit showing an internal wiring and an external wiring of a block.
Figure 4B:
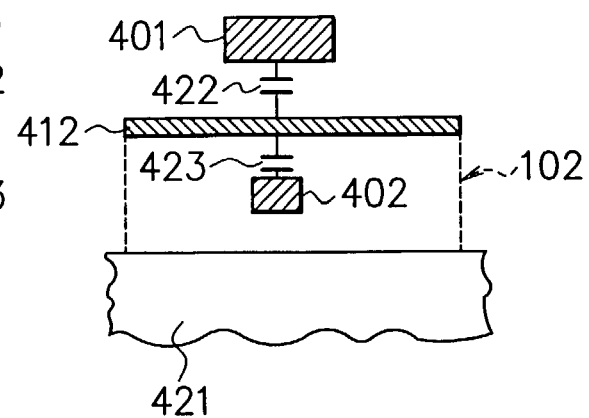
FIG. 4B is a cross sectional view taken along the I—I line in FIG. 4A.

FIG. 4A and FIG. 4B correspond to FIG. 13A and FIG. 13B. FIG. 4A is a top view of a semiconductor circuit including a wiring 402 on an internal side of the block 102 and a wiring 401 on an external side thereof, and FIG. 4B is a cross sectional view taken along the I—I line in FIG. 4A. The block 102 is provided on a semiconductor substrate 421. The external wiring 401 passes over the block 102. On a boundary part on an upper face of the block 102 between the external wiring 401 and the internal wiring 402, power source potential wirings 411 and reference potential wirings 412 are arranged alternately via insulation portions 413. The power source potential wirings 411 and the reference potential wirings 412 have a function as a shield wiring as well as having a function as a power source supply wiring. For example, the power source supply wirings 411 and 412 can supply power source to a circuit inside the block 102.

Next, the function of the wirings 411 and 412 as a shield wiring will be explained. In FIG. 4B, the shield wiring 412 shields the internal wiring 402 and the external wiring 401 from each other. A parasitic capacitance 423 exists between the internal wiring 402 and the shield wiring 412, and a parasitic wiring 422 exists between the external wiring 401 and the shield wiring 412. In other words, there is no need to take into account a coupling capacitance between the internal wiring 402 and the external wiring 401. In the lower level hierarchical designing, the parasitic capacitance 423 between the internal wiring 402 and the shield wiring 412 can be calculated irrespective of the existence or nonexistence of the external wiring 401. Similarly, in the upper level hierarchical designing, the parasitic capacitance 422 between the external wiring 401 and the shield wiring 412 can be calculated irrespective of the existence or nonexistence of the internal wiring 402. Further, there is no need to take into account a crosstalk noise between the internal wiring 402 and the external wiring 401. The shield wirings 411, 412 thus laid so as to cover the upper face of the block 102 are hereinafter referred to as overshield wirings.

FIG. 5 is a perspective view of a semiconductor device corresponding to the semiconductor circuit in FIG. 4. The structure of this semiconductor device will be explained. A first to a third wiring layer are formed on a semiconductor substrate 501 via respective insulation layers. A reference potential wiring 502 is formed on the first wiring layer, and a reference potential wiring 503 is formed on the second wiring layer. The reference potential wirings 502 and 503 function as a shield wiring. On the third wiring layer, reference potential wirings 504 and power source potential wirings 505 are arranged alternately via insulation portions. Contact portions 510 electrically connect the reference potential wirings 502 and 503 to each other. Contact portions 511 electrically connect the reference potential wirings 503 and 504 to each other. Reference potential supply wirings 506 supply a reference potential to the left portion of the reference potential wiring 503 from an external part. Reference potential supply wirings 508 supply a reference potential to the right portion of the reference potential wiring 503 from the external part. The reference potential is supplied to the reference potential wirings 504 from the reference potential supply wirings 506 and 508 via the wiring 503 and the contact portions 511. Similarly, power source potential supply wirings 507 supply a power source potential to the left portion of the power source potential wirings 505 from the external part. Power source potential supply wirings 509 supply a power source potential to the right portion of the power source potential wirings 505 from the external part. The wirings 504 and 505 have a function as a shield wiring and a power source supply wiring.

Further, the reference potential wiring 503 has an aperture 513 for a wiring 512, which connects the internal side and the external side of the block, to pass therethrough. An external wiring 514 is an external wiring passing over the block. The shield wirings 504 and 505 shield the external wiring 514 and the internal wirings from each other.

Figure 6:
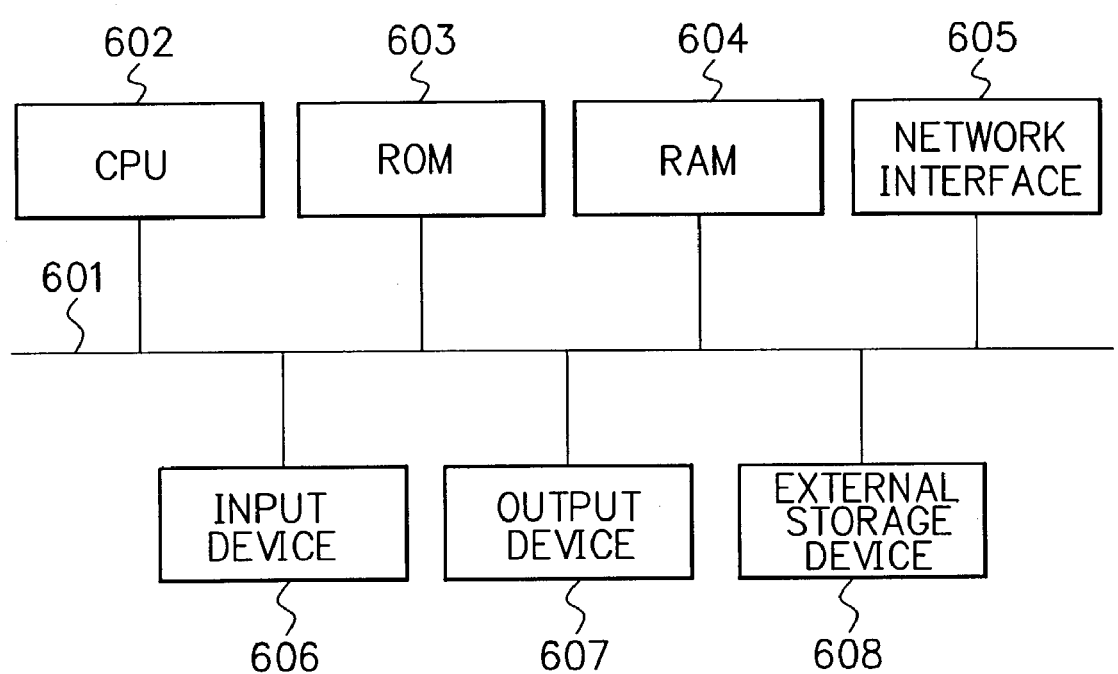
FIG. 6 is a hardware block diagram of a computer for use in CAD design according to this embodiment.

FIG. 6 is a hardware block diagram of a computer for use in CAD design according to this embodiment. A central processing unit (CPU) 602, a ROM 603, a RAM 604, a network interface 605, an input device 606, an output device 607, and an external storage device 608 are connected to a bus 601.

The CPU 602 performs data processing and operations while controlling the above constituent units connected thereto via the bus 601. A boot program is stored in the ROM 603 in advance, and the execution of this boot program by the CPU 602 activates the computer. A computer program is stored in the external storage device 608, and this computer program is copied onto the RAM 604 to be executed by the CPU 602. The execution of the computer program (CAD software) by this computer enables a semiconductor circuit (device) to be designed.

The external storage device 608 is, for example, a hard disk storage device or the like, and the storage contents thereof do not extinguish even when the power supply is cut off. The external storage device 608 is capable of recording a computer program and design data on a recording medium and reading the computer program and the design data from the recording medium.

The network interface 605 is capable of inputting and outputting the computer program and the design data to a network. The input device 606 is, for example, a keyboard and pointing device (mouse), or the like, and is capable of performing various kinds of designations, inputs, and so on. The output device 607 is a display and printer, or the like.

Figure 7:
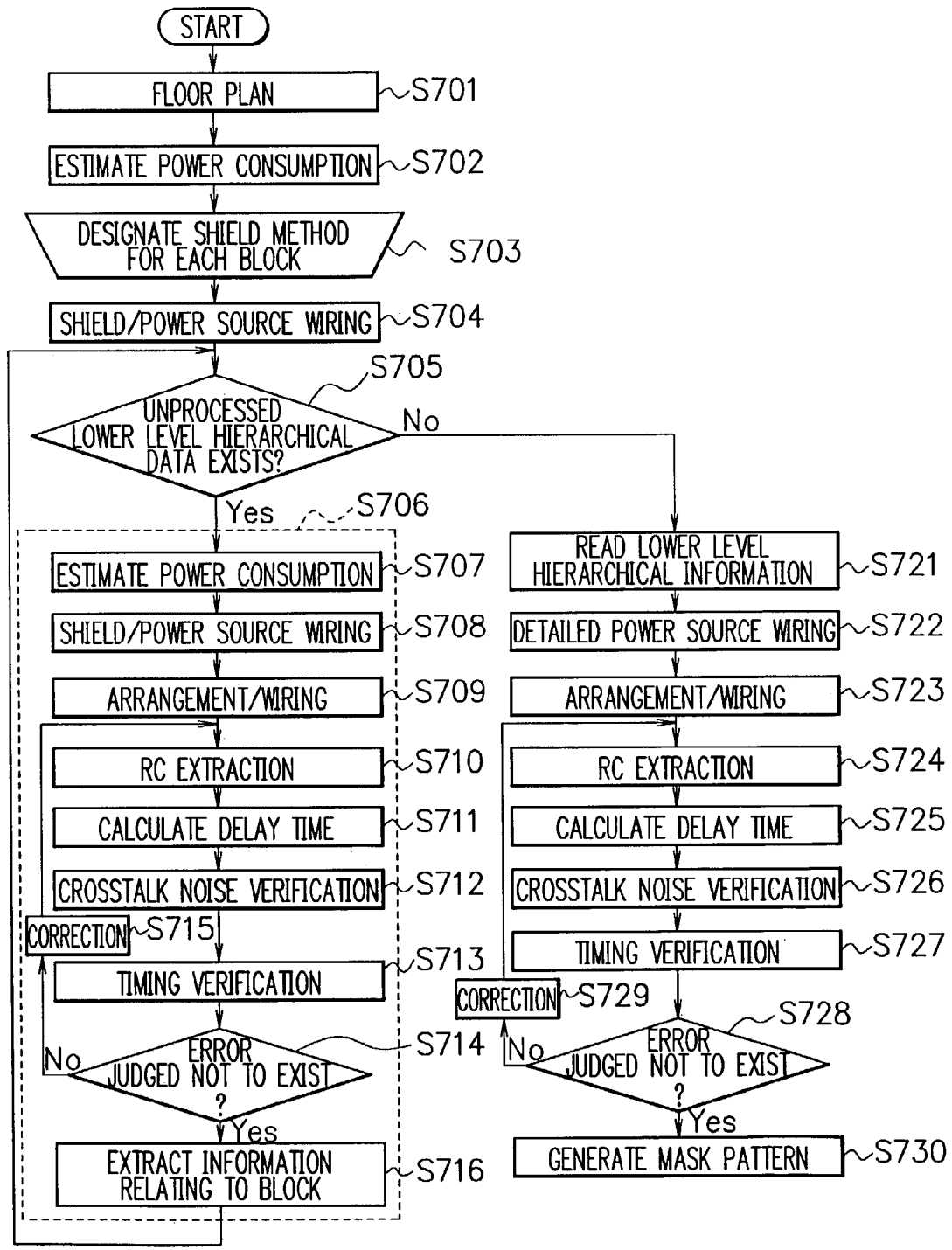
FIG. 7 is a flow chart showing a hierarchical designing procedure of a semiconductor circuit according to this embodiment.

FIG. 7 is a flow chart showing a hierarchical designing procedure of a semiconductor circuit according to this embodiment. This designing is CAD design processing by means of a program using the aforesaid computer.

In Step S701, a floor plan is designed. The position, size, external wirings, and so on of blocks are roughly determined on an upper level of hierarchy. Next, in Step S702, power consumption is estimated on the upper level of hierarchy. Next, in Step S703, a shield method is designated for each block. For example, it is designated whether shield wirings are to be laid on an inner side of the block boundary or an external side thereof. When the shield wirings are to be laid on the inner side, the shield wirings are laid in the blocks in the lower level hierarchical designing. When, on the other hand, the shield wirings are to be laid on the external side, the shield wirings are laid on the external side of the blocks in the upper level hierarchical designing. The details of how the shield method is designated will be explained later with reference to FIG. 8.

Next, in Step S704, the shield wirings and the power source wirings are laid according to the above-mentioned shield method on the upper level of hierarchy. When the designation to lay the shield wirings on the external side of the blocks is given, the shield wirings are laid in this step. The thickness of the power source wirings is determined according to the aforesaid power consumption. Next, in Step S705, it is checked whether or not there is any unprocessed lower level hierarchical data. When there exists any unprocessed data, Step S707 is initiated while Step S721 is initiated when no unprocessed data exists. Step S706 includes Steps S707 to S716 and is for processing the inside of blocks of the lower level of hierarchy.

In Step S707, power consumption is estimated. Next, in Step S708, the shield wirings and the power source wirings are laid according to the aforesaid shield method. When the designation is given to lay the shield wirings on the inner side of the block, the shield wirings are laid in this step. The thickness of the power source wirings is determined depending on the aforesaid power consumption. Next, in Step S709, the arrangement and wiring of cells in the block are carried out. Next, in Step S710, a resistive component and a capacitive component (RC) are extracted. At this time, since the boundary part of the block is shielded, accurate RC extraction is possible irrespective of the condition of the outside of the block. For example, the parasitic capacitance 204 in FIG. 2 is extracted. Next, in Step S711, delay time is calculated based on the above-mentioned resistive component and capacitive component. Next, in Step S712, a crosstalk noise is verified. At this time, since the boundary part of the block is shielded, accurate verification is possible irrespective of the condition of the outside of the block. When the verification result indicates that the crosstalk noise will give an adverse effect, a crosstalk noise error is outputted. Next, in Step S713, timing of a circuit in the block is verified based on the above-mentioned delay time. When the verification result indicates that the timing is not within a prescribed value range, a timing error is outputted.

Next, in Step S714, it is checked whether or not there exists any crosstalk noise error or timing error. When there exists any error, Step S715 is initiated while Step S716 is initiated when there exists no error. In Step S715, the arrangement, wiring, and so on of the cells are corrected and the processing from Step S710 is repeated. The above processing is repeated until there exists no error. When there exists no error, information relating to the block is extracted in Step S176. For example, information on the position of external terminals, the position of the power source wirings, and so on are extracted. Thereafter, the procedure returns to Step S705. When there exists any other unprocessed block, the above processing in Step S706 is repeated. When the processing for all the blocks has been finished, Step S721 is initiated. Steps S721 to S729 are for design processing of the upper level of hierarchy.

In Step S721, the information on the blocks of the lower level of hierarchy is read. Next, in Step S722, the power source wirings are laid in detail. Next, in Step S723, the arrangement of the blocks 102 and the cells 104, the wiring of the external wirings 103, and so on are carried out. Next, in Step S724, a resistive component and a capacitive component (RC) are extracted. At this time, since the boundary parts of the blocks are shielded, accurate RC extraction is possible irrespective of the conditions of the inside of the blocks. For example, the parasitic capacitance 205 in FIG. 2 is extracted. Next, in Step S725, delay time is calculated based on the above-mentioned resistive component and capacitive component. Next, in Step S726, a crosstalk noise is verified to output a crosstalk noise error according to the verification result. At this time, since the boundary parts of the blocks are shielded, accurate verification is possible irrespective of the conditions of the inside of the blocks. Next, in Step S727, timing of the circuit of the upper level of hierarchy is verified based on the above-mentioned delay time to output a timing error according to the verification result.

Next, in Step S728, it is checked whether or not there exists any crosstalk noise error or timing error. When there exists any error, Step S729 is initiated while Step S730 is initiated when there exists no error. In Step S729, the arrangement, wiring, and so on of the blocks and the cells are corrected and the processing from Step S724 is repeated. When it is judged in Step S728 that there exists no error, Step S730 is initiated to generate a mask pattern of each of the layers of the semiconductor device, and thereafter the semiconductor device is fabricated.

In this embodiment, since the boundary parts of the blocks are shielded, accurate RC extraction is possible in Steps S710 and S724, and accurate crosstalk noise verification is possible in Steps S712 and S726. Moreover, since the boundary parts of the blocks are shielded, the conditions of the block boundaries are simple, which allows the above processing to be carried out in a simple manner.

Figure 14:
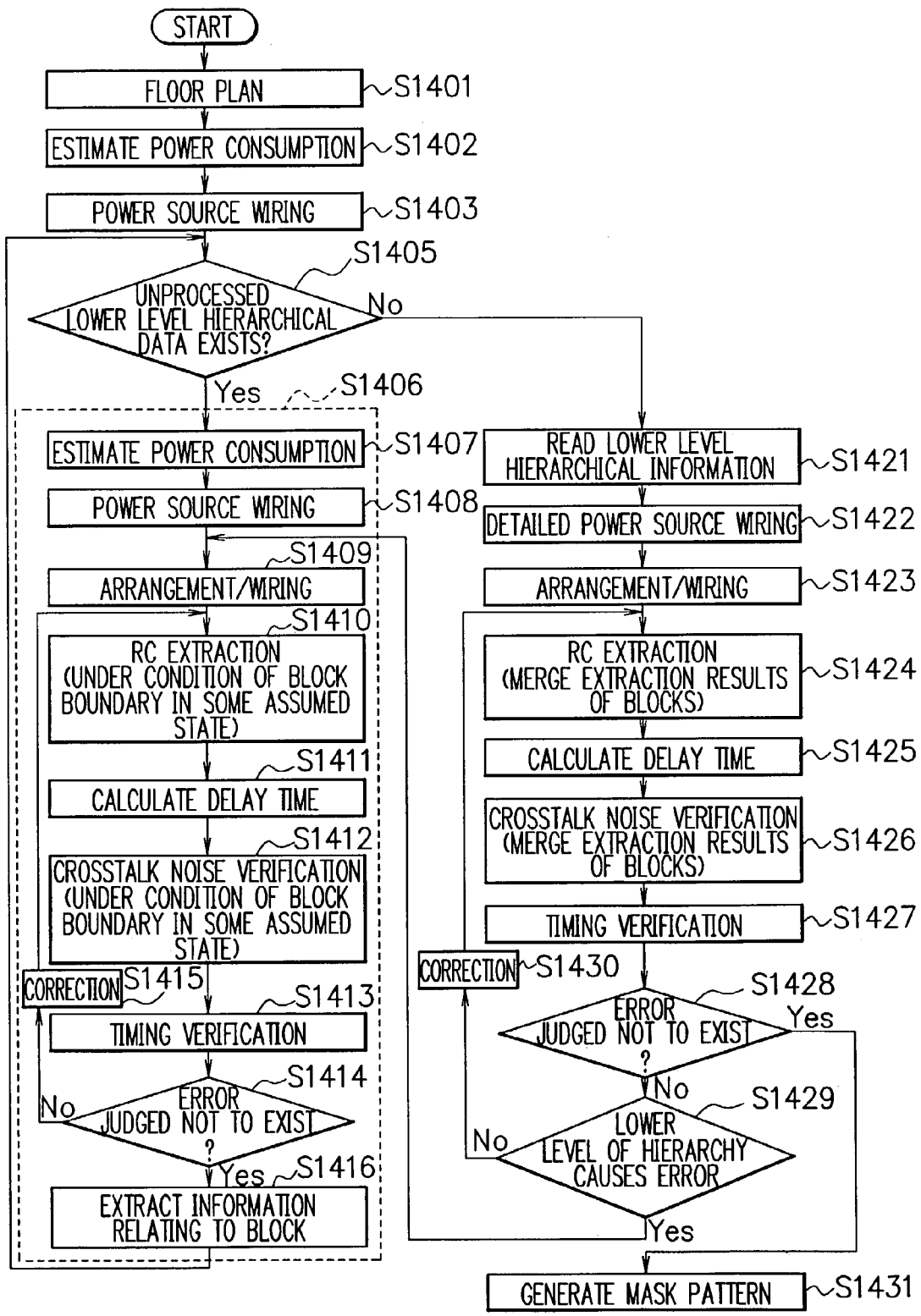
FIG. 14 is a flow chart showing a hierarchical designing procedure of a semiconductor circuit according to a prior art.

In the case of FIG. 14, since the boundary part of the block is not shielded, the RC extraction and the crosstalk noise verification are carried out under the assumed boundary condition of the block, which does not allow accurate processing. Consequently, there arises a necessity of checking in Step S1429 which of the lower level of hierarchy or the upper level of hierarchy causes the error. Then, when the lower level of hierarchy causes the error, it is necessary to return to Step S1409 and to redesign the inside of the block. This redesigning lowers designing efficiency and prolongs time required for designing.

In this embodiment, since accurate RC extraction and crosstalk noise verification are possible, such redesigning is not necessary. This enables efficient designing and reduction in designing time (TAT).

FIG. 8 shows a screen for use in designating a shield method in Step S703 in FIG. 7. This screen is displayed on the display 607 in FIG. 6 and the designation is given through a user's operation. Target Name 801 represents the name of a block to be shielded, for example "DATA_CORE". Items 811, which are items to be designated for laying the frame shield wiring shown in FIG. 2 and FIG. 3, include Shield Wiring 802 and Shield Wiring Layers 803. In the Shield Wiring 802, "OFF" is a radio button for instructing that the shield wiring is not to be laid, "AT TOP" is a radio button for instructing that the shield wiring is to be laid on the external side of the boundary of the block, and "AT HLB" is a radio button for instructing that the shield wiring is to be laid on the internal side of the boundary of the block. In Shield Wiring Layers 803, it is designated how many layers from the semiconductor substrate are to be shielded. For example, in the case of FIG. 3, the frame shield wirings 302 to 304 are to be laid from the first wiring layer to the third wiring layer.

Items 812, which are items to be designated for laying the overshield wiring shown in FIG. 4 and FIG. 5, include Shield Wiring 804 and Shield. Wiring Layer 805. In Shield Wiring 804, "OFF", "AT TOP", and "AT HLB" have the same functions as those in Shield Wiring 802. In Shield Wiring Layer 805, it is designated on which layer from the bottom the overshield wiring is to be laid. For example, the overshield wirings 504, 505 are laid on the third wiring layer in FIG. 5.

An "OK" button 821 is a button for having the designations on this screen applied. A "CLEAR" button 822 is a button for canceling the designations on this screen.

For example, when the block is a hard macro (for example, a RAM, a ROM, or the like) or an IP macro, the design inside the block is uncorrectable. In that case, the shield wiring cannot be provided inside the block, and it is necessary to designate to provide the shield wiring on the external side of the block. In the case of a block in which the internal design is correctable, the shield wiring may be provided either on the internal side or the external side of the block.

Incidentally, in the case of bottom-up layout designing, a shield wiring method is selected from the screen shown in FIG. 8 at an initial stage.

Figure 9:
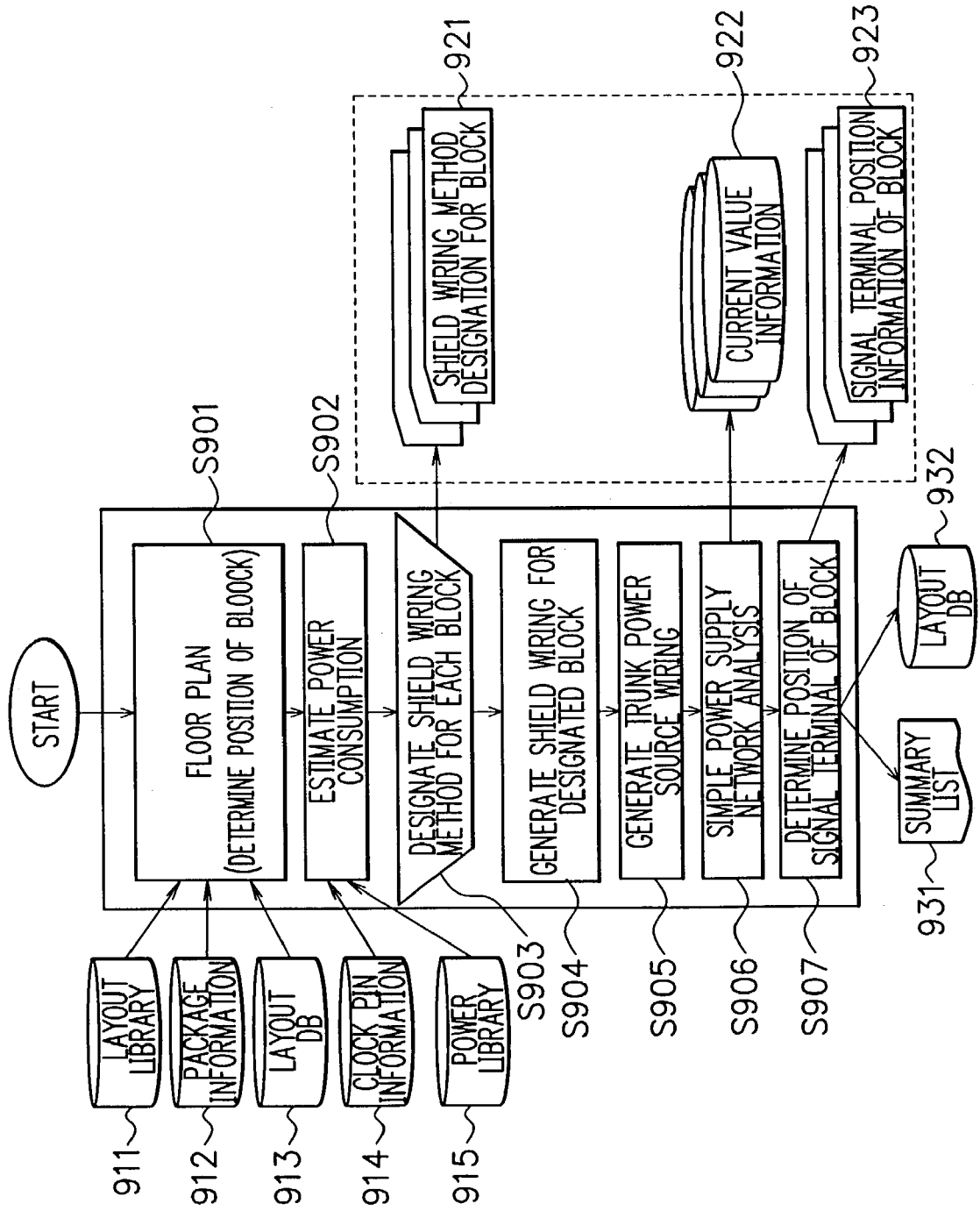
FIG. 9 is a flow chart showing in detail processing of Steps S701 to S704 in FIG. 7.

FIG. 9 is a flow chart showing the processing in Steps S701 to S704 in FIG. 7 in detail, in which the design processing of the upper level of hierarchy is shown. In Step S901, a floor plan is designed based on a layout library 911, package information 912, and a layout database 913. Specifically, the position and the like of a block are determined. Incidentally, the layout library 911 and so on are stored in the external storage device 708 in FIG. 6. Next, in Step S902, power consumption is estimated based on clock pin information 914 and a power library 915. Next, in Step S903, a shield wiring method is designated for each block on the screen in FIG. 8 to output a file 921 containing the contents of the designation, for saving. The contents of the file 921 will be later explained with reference to FIG. 10. Next, in Step S904, a shield wiring for a designated block is generated. Next, in Step S905, a trunk power source wiring is generated. Specifically, the pitch of the power source wirings and the width of the power source wirings are determined according to the estimated power consumption to wire a trunk portion of a power source. At this time, when the width of the shield wiring generated previously is insufficient, other power source wirings are combined to adjust the width thereof. Next, in Step S906, simple power supply network analysis is made, and a file 922 containing current value information is outputted for each block for saving. Specifically, it is checked based on the estimated power consumption for a power source wiring network whether or not there occur any voltage drop and current density violation. At the same time, a value of a current flowing from the upper level of hierarchy to the lower level of hierarchy is calculated and the file 922 containing the current value information is saved in a specialized database. Next, in Step S907, the positions of signal terminals of each of the blocks are determined, and a file 923 containing the information thereof is outputted for saving. Thereafter, the layout information is saved in a layout database 932, and a processing step is outputted to a summary list file 931. Specifically, the terminal positions of the blocks of the lower level of hierarchy are determined based on the connection relationship between the positions of the blocks and the wirings thereof. The coordinates and wiring layer thereof are written in the layout database 932. The above-mentioned files 921 to 923 are used in designing the inside of the blocks of the lower level of hierarchy.

FIG. 10 shows a content example of the shield wiring method designation file 921 in FIG. 9. TARGET NAME 1001, FRAME SHIELD WIRING 1002, FRAME SHIELD WIRING LAYERS 1003, OVERSHIELD WIRING 1004, and OVERSHIELD WIRING LAYER 1005 correspond to the designated items 801 to 805 in FIG. 8 respectively. The file 921 contains the information on the designated contents on the screen in FIG. 8, and further contains MAXIMUM WIRING LAYER 1006. MAXIMUM WIRING LAYER 1006 indicates the number of the wiring layers usable in that block.

Figure 11:
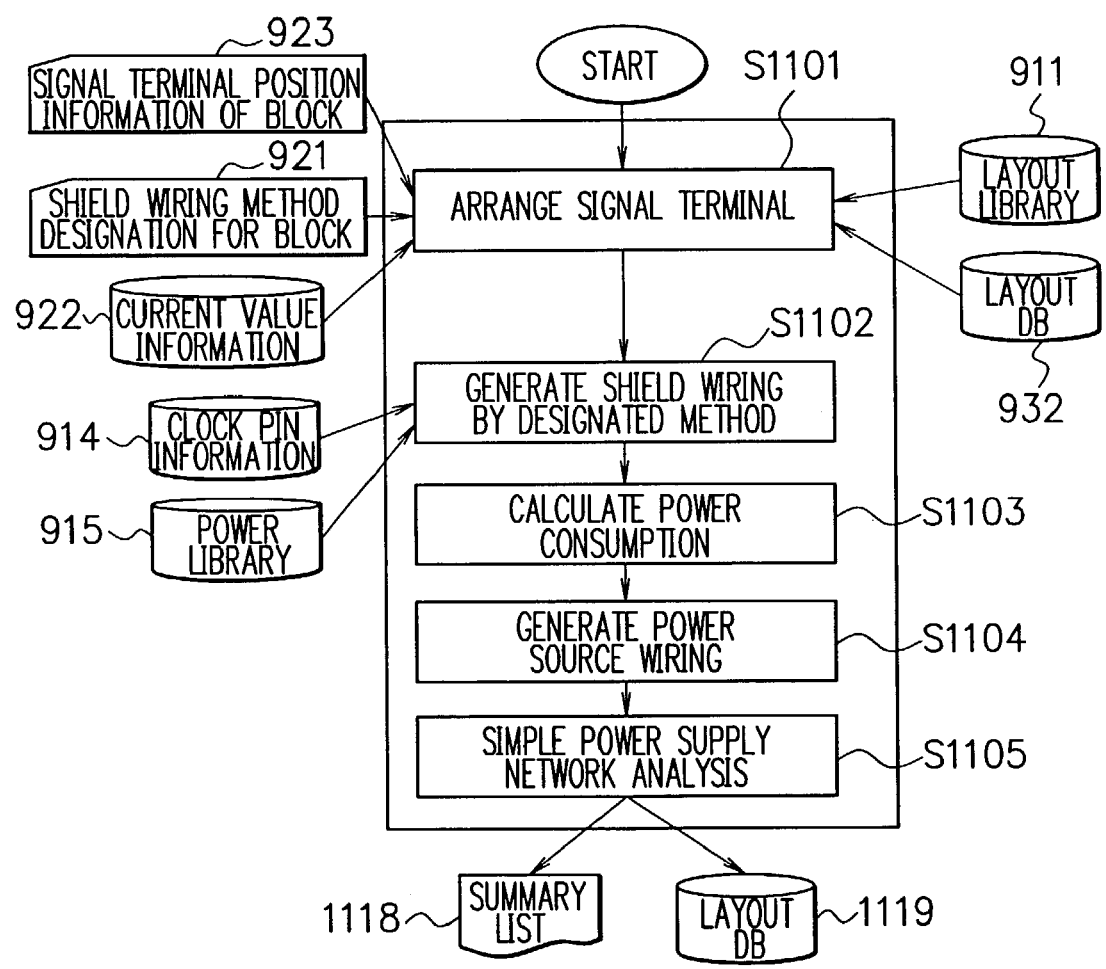
FIG. 11 is a flow chart showing in detail processing in Steps S707 and S708 in FIG. 7.

FIG. 11 is a flow chart showing in detail the processing in Steps 9707 and S708 in FIG. 7, in which the design processing of the lower level of hierarchy is shown. In Step S1101, signal terminals inside the block are arranged based on the block shield wiring method designation file 921, the current value information file 922, the file 923 containing the information on the signal terminal location of the block, the layout library 911, and the layout database 932, which are shown in FIG. 9. Next, in Step S1102, the shield wirings are generated by the shield wiring method designated above based on the clock pin information 914 and the power library 915. Next, in Step S1103, power consumption is calculated. Next, in Step S1104, the power source wirings are generated. Specifically, the pitch of the power source wirings and the width of the power source wirings are calculated based on the current value supplied from the upper level of hierarchy estimated in the upper level hierarchical designing and the power consumption inside the block, and at the same time, a power terminal of the block is generated. Next, in Step S1105, a simple power supply network analysis is made. Specifically, similarly to the processing of the upper level of hierarchy, it is checked based on the power consumption estimated for the power source wiring network whether or not there occur any voltage drop and current density violation. Thereafter, the layout information is saved in a layout database 1119, and a processing step is outputted to a summary list file 1118.

As described hitherto, this embodiment has the lower level hierarchical designing step and the upper level hierarchical designing step. The lower level hierarchical designing step is for designing a semiconductor circuit inside a block. The upper level hierarchical designing step is for designing the external wiring of the block. The lower level hierarchical designing step or the upper level hierarchical designing step includes the shield wiring designing step of providing the shield wiring on the boundary part of the block. Either the lower level hierarchical designing step or the upper level hierarchical designing step may come first or they may be synchronized with each other (be in parallel). The shield wiring may be either the power potential wiring or the reference potential wiring.

In FIG. 5, the overshield wirings 504 and 505 are provided on the upper most wiring layer inside the block or a wiring layer thereon so as to cover the block. Further, the shield wiring is not limited to be provided on the upper face of the block, but may be provided on the bottom face thereof. The shield wiring is provided on the wiring layer so as to cover the upper face or the bottom face of the boundary of the block.

By shielding the boundary of the block with the shield wiring, each of the blocks can be regarded as a part so that independency inside the block can be maintained. Further, by shielding the boundary of the block with the shield wiring, precision in the extracted value of the wiring capacitance in the vicinity of the boundary and precision in the calculation of the crosstalk noise value can be enhanced. In FIG. 14, in the case of a top-down designing in sequence from the upper level of hierarchy to the lower level of hierarchy, since physical conditions of the boundary of the block cannot be fixed until the arrangement and the wiring of the lower level of hierarchy are determined, the capacitance extraction needs to be carried out under some assumed conditions. According to this embodiment, however, the boundary of the block is shielded, which eliminates the necessity of the assumption of the boundary conditions.

Moreover, each of the blocks is regarded as a part so that the layout designing of the blocks can progress in parallel. Since independency of the layout for each block is maintained, the designing for each level of hierarchy can progress independently without being influenced by the states of the other level of hierarchy and other blocks. Further, the same wirings function both as the shield wirings and the power source wirings so that power supply to the inside of the block can be augmented. Moreover, the connection of the overshield wiring on the upper face of the block to the power source wiring inside the block increases places through which power can be supplied to the inside of the block and also results in stabilization of voltage inside the block. In addition, since little consideration needs to be given to the influence between the levels of hierarchy, the-layout inside the block can be changed easily. This can shorten the layout designing period and enhance quality.

This embodiment can be realized through the execution of a program by a computer. Further, a means for supplying the computer with the program, for example, a computer-readable recording medium recording such a program thereon such as a CD-ROM and the like, or a transmission medium for transmitting such a program such as the Internet and the like is also applicable as an embodiment of the present invention. Further, a computer program product recording the above program thereon such as a computer-readable recording medium and the like is also applicable as an embodiment of the present invention. The above-mentioned program, recording medium, transmission medium, and computer program product are embraced within the range of the present invention. As the recording medium, for example, a flexible disk, a hard disk, an optical disk, a magneto-optic disk, a CD-ROM, a magnetic tape, a non-volatile memory card, a ROM, and the like are usable.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As described hitherto, since the boundary part of the block can be shielded, the internal part and the external part of the boundary can be completely separated so that the block can be considered as one independent part. Consequently, the lower level hierarchical designing and the upper level hierarchical designing can be made independent from each other, which enables simple, quick, and accurate designing of a semiconductor circuit.

What is claimed is:

1. A semiconductor circuit designing method, comprising:
 a lower level hierarchical designing step of designing a semiconductor circuit inside a block; and
 an upper level hierarchical designing step of designing an external wiring of said block,
 wherein said lower level hierarchical designing step or said upper level hierarchical designing step includes a shield wiring designing step of designing to provide a shield wiring on a boundary part of said block, wherein said shield wiring designing step provides the option of designing to provide the shield wiring on a boundary part on an internal side and designing to provide the shield wiring on a boundary part on an external side of said block.

2. The semiconductor circuit designing method according to claim 1, wherein either said lower level hierarchical designing step or said upper level hierarchical designing step comes first or they are synchronized with each other.

3. The semiconductor circuit designing method according to claim 1,
wherein said semiconductor circuit includes a plurality of wiring layers, and
wherein said shield wiring designing step designs to provide the shield wiring on a boundary part of each of the wiring layers of said block.

4. The semiconductor circuit designing method according to claim 1,
wherein said semiconductor circuit includes a plurality of wiring layers, and
wherein said shield wiring designing step designs to provide the shield wiring on the wiring layers so as to cover an upper face or a lower face of a boundary of said block.

5. The semiconductor circuit designing method according to claim 1,
wherein said semiconductor circuit includes a plurality of wiring layers, and
wherein said shield wiring designing step designs to provide the shield wiring on the upper most wiring layer in said block or a wiring layer thereon so as to cover said block.

6. The semiconductor circuit designing method according to claim 5, wherein said shield wiring is a power source potential wiring or a reference potential wiring.

7. The semiconductor circuit designing method according to claim 6, wherein said shield wiring is a power source supply wiring.

8. The semiconductor circuit designing method according to claim 1,
wherein said shield wiring is a power source potential wiring or a reference potential wiring.

9. The semiconductor circuit designing method according to claim 1, wherein each of said lower level hierarchical designing step and said upper level hierarchical designing step includes a step of extracting a resistive component and a capacitive component based on the shield wiring on the boundary part of said block and a step of verifying timing based on said resistive component and capacitive component.

10. The semiconductor circuit designing method according to claim 9, wherein each of said lower level hierarchical designing step and said upper level hierarchical designing step includes a step of verifying a crosstalk noise based on the shield wiring on a boundary part of said block.

11. The semiconductor circuit designing method according to claim 1, wherein each of said lower level hierarchical designing step and said upper level hierarchical designing step includes a step of verifying a crosstalk noise based on the shield wiring on a boundary part of said block.

12. The semiconductor circuit designing method according to claim 1, wherein said shield wiring has an aperture for a wiring, which connects an internal side and an external side of said block, to pass therethrough.

13. The semiconductor circuit designing method according to claim 1, further comprising:
a step of instructing on which side of the internal side and the external side of said block said shield wiring is to be provided.

14. A semiconductor circuit designing apparatus, comprising:
a lower level hierarchical designing part for designing a semiconductor circuit inside a block; and
an upper level hierarchical designing part for designing an external wiring of said block,
wherein one of said lower level hierarchical designing part and said upper level hierarchical designing part includes a shield wiring designing part which designs to provide a shield wiring on a boundary part of said block, wherein said shield wiring designing part provides the option of designing to provide the shield wiring on a boundary part on an internal side and designing to provide the shield wiring on a boundary part on an external side of said block.

15. A computer program product, comprising:
first computer-readable program code means for a lower level hierarchical designing procedure of designing a semiconductor circuit inside a block; and
second computer-readable program code means for an upper level hierarchical designing procedure of designing an external wiring of said block,
wherein one of said first computer-readable program code means and said second computer-readable program code means includes a computer-readable program code means for a shield wiring designing procedure of designing to provide a shield wiring on a boundary part of said block, wherein said shield wiring designing procedure provides the option of designing to provide the shield wiring on a boundary part on an internal side and designing to provide the shield wiring on a boundary part on an external side of said block.

16. A semiconductor device, comprising:
a block in a semiconductor circuit, including a plurality of wiring layers;
a shield wiring provided on a boundary part of each of the wiring layers of said block;
an external wiring connecting an internal side and an external side of said block; and
an aperture provided in said shield wiring in order to have said external wiring pass therethrough, with the option of providing the shield wiring on a boundary part on an internal side and providing the shield wiring on a boundary part on an external side of said block.

17. A semiconductor device, comprising:
a block in a semiconductor circuit, including a plurality of wiring layers;
a shield wiring having a power source potential wiring and a reference potential wiring alternately provided on the upper most wiring layer of said block; and
an insulation part provided between said power source potential wiring and said reference potential wiring.

* * * * *